United States Patent
Reber et al.

(10) Patent No.: US 10,553,508 B2
(45) Date of Patent: Feb. 4, 2020

(54) SEMICONDUCTOR MANUFACTURING USING DISPOSABLE TEST CIRCUITRY WITHIN SCRIBE LANES

(71) Applicants: Douglas M. Reber, Austin, TX (US); Sergio A. Ajuria, Austin, TX (US); Phuc M. Nguyen, Austin, TX (US)

(72) Inventors: Douglas M. Reber, Austin, TX (US); Sergio A. Ajuria, Austin, TX (US); Phuc M. Nguyen, Austin, TX (US)

(73) Assignee: NXP USA, INC., Austin, TX (US)

( * ) Notice: Subject to any disclaimer, the term of this patent is extended or adjusted under 35 U.S.C. 154(b) by 1011 days.

(21) Appl. No.: 14/153,417

(22) Filed: Jan. 13, 2014

(65) Prior Publication Data

US 2015/0200146 A1    Jul. 16, 2015

(51) Int. Cl.
*H01L 21/66* (2006.01)
*H01L 21/78* (2006.01)
*H01L 23/00* (2006.01)

(52) U.S. Cl.
CPC .............. *H01L 22/34* (2013.01); *H01L 21/78* (2013.01); *H01L 23/562* (2013.01)

(58) Field of Classification Search
CPC ......................... H01L 22/34; H01L 2223/5446
USPC ............................................ 257/48, E23.179
See application file for complete search history.

(56) References Cited

U.S. PATENT DOCUMENTS

| | | | |
|---|---|---|---|
| 5,583,370 A | 12/1996 | Higgins, III et al. | |
| 5,982,042 A * | 11/1999 | Nakamura | H01L 21/78 257/203 |
| 6,180,503 B1 | 1/2001 | Tzeng et al. | |
| 6,492,716 B1 | 12/2002 | Bothra et al. | |
| 6,753,608 B2 | 6/2004 | Tomita | |
| 6,777,263 B1 | 8/2004 | Gan et al. | |
| 6,951,801 B2 | 10/2005 | Pozder et al. | |
| 2008/0083959 A1* | 4/2008 | Wu | H01L 23/585 257/416 |
| 2008/0277659 A1 | 11/2008 | Hsu et al. | |

(Continued)

OTHER PUBLICATIONS

Lee et al., "HBr Plasma Based Copper Etch Process", Department of Chemical Engineering, Texas A&M University, 1 pg. (Apr. 2002).

(Continued)

*Primary Examiner* — Moazzam Hossain
*Assistant Examiner* — Hajar Kolahdouzan (57) ABSTRACT

Embodiments are disclosed for semiconductor manufacturing using disposable test circuitry formed within scribe lanes. The manufacturing steps can include forming device circuitry within a semiconductor die and forming test circuitry within a scribe lane. One or more electrical connection route lines are also formed that connect the device circuitry and test circuitry blocks. Further, each die can be connected to a single test circuitry block, or multiple dice can share common test circuitry blocks. After testing, the electrical connection route line(s) are sealed, and the test circuitry is discarded when the device dice are singulated. For certain embodiments, the edge of the devices dice are encapsulated with a protective metal layer, and certain other embodiments include protective sealrings through which the connection route lines pass to enter the dice from the test circuitry blocks within the scribe lanes.

5 Claims, 12 Drawing Sheets

(56) References Cited

U.S. PATENT DOCUMENTS

| | | | |
|---|---|---|---|
| 2009/0057842 A1* | 3/2009 | He | H01L 22/32 |
| | | | 257/620 |
| 2011/0050275 A1* | 3/2011 | Mollat | G01R 31/2884 |
| | | | 324/762.05 |
| 2012/0322237 A1 | 12/2012 | Lei et al. | |
| 2012/0326246 A1 | 12/2012 | Iwasaki et al. | |
| 2013/0026466 A1* | 1/2013 | Pagani | 257/48 |
| 2014/0077320 A1* | 3/2014 | Chen | H01L 27/1464 |
| | | | 257/431 |

OTHER PUBLICATIONS

Applied Materials Silicon Technologies, Because Innovation Matters, Through-Silicon via 3D Integration, 5 pgs. (Jan. 2010).

* cited by examiner

SEMICONDUCTOR MANUFACTURING USING DISPOSABLE TEST CIRCUITRY WITHIN SCRIBE LANES

TECHNICAL FIELD

This technical field relates to semiconductor processing and, more particularly, to test circuitry for semiconductor devices.

BACKGROUND

Test circuitry is often included within a semiconductor device die so that self test procedures can be utilized after manufacture of the semiconductor device die. Having self test circuitry built into the semiconductor device die often improves test cycle time; however, this self test circuitry consumes a portion of the die area thereby increasing the size for the resulting semiconductor package for the die. Further, this self test circuit can also require externally accessible test connection pads that are electrically active, and these test pads can lead to misuse by customers. For example, a semiconductor die can include one or more pins on a package that are only used during test procedures. These test-only pins can lead to incorrect use or treatment by end customers that lead to device failures. Further, even when properly grounded by the end customer, such test-only pins still must meet full ESD (electro-static discharge) and latch-up requirements for external pins in order to achieve customer qualification. Thus, while it is efficient for test purposes to include test circuitry within the semiconductor die, this on-chip test circuitry can require increased die and package sizes and lead to problems from customer misuse.

Figure 1:
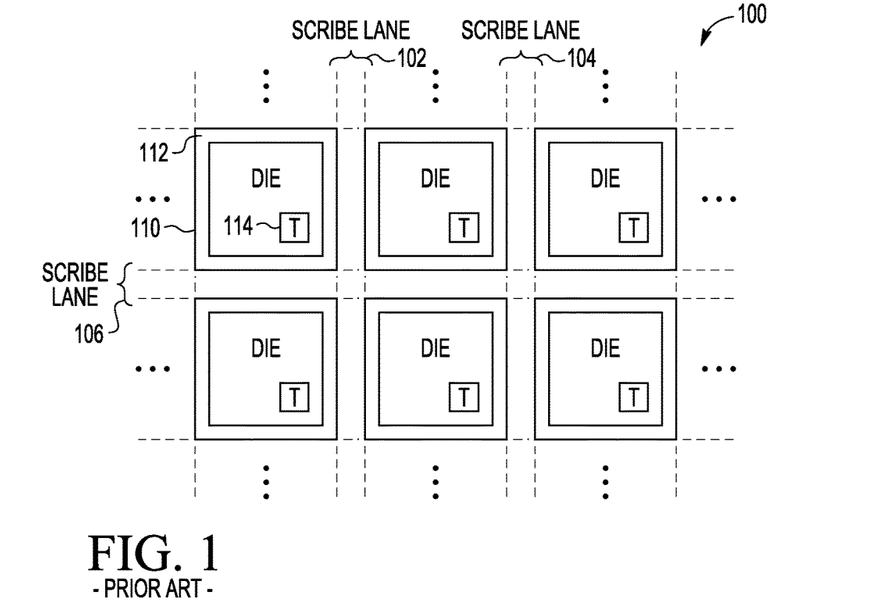
FIG. 1 (Prior Art) is a top view diagram of an embodiment for a plurality of semiconductor device dice formed on a semiconductor substrate.

FIG. 1 (Prior Art) is a top view diagram of an embodiment 100 for a plurality of semiconductor device dice formed on a semiconductor substrate. As represented with respect to die 110, each of the dice include test circuitry (T) 114 and a sealring 112. The sealring 112 provides a protective metal barrier for the internal device circuitry within the die 110, such as test circuitry 114. The sealring 112 is formed using metal layers and metal vias through dielectric layers that lie between the metal layers. The structures for the sealring 112 are formed during semiconductor processing steps used to form the device circuitry for the semiconductor device dice. Scribe lanes 102, 104, and 106 are also shown for embodiment 100. The scribe lanes 102/104/106 represent relative locations where one or more cuts will be made to singulate the semiconductor device dice once the semiconductor processing steps for the semiconductor substrate are completed. It is noted that while only a few dice are shown in embodiment 100, additional semiconductor dice and related scribe lanes would be provided across the entire semiconductor substrate, such as a semiconductor wafer, being used to manufacture the semiconductor device dice. Once singulated, these semiconductor dice are packaged in various ways to form packaged integrated circuits.

Figure 2:
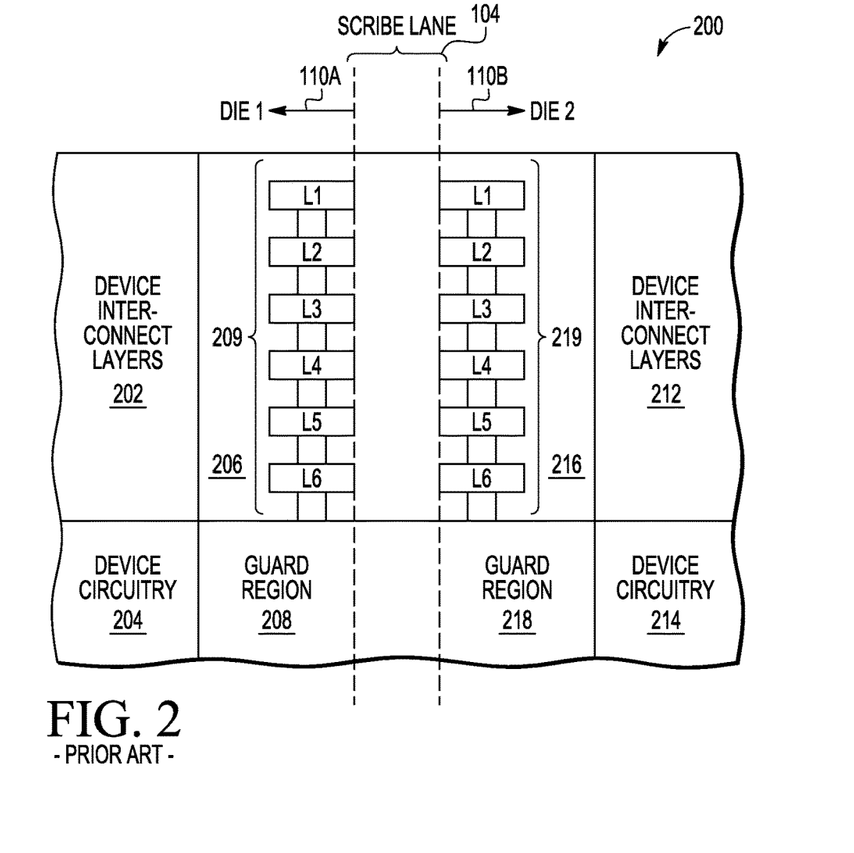
FIG. 2 (Prior Art) is a cross-section view of an embodiment for sealring structures positioned on either side of a scribe lane.

FIG. 2 (Prior Art) is a cross-section view of an embodiment 200 for sealring structures 209/219 positioned on either side of a scribe lane 104. For the embodiment 200 shown, a first die (DIE1) 110A is located to the left of scribe lane 104, and a second die (DIE2) 110B is located to the right of scribe lane 104. The first die 110A includes device circuitry 204 formed within a semiconductor substrate using one or more processing steps, and first die 110A includes device metal interconnect layers 202 that are formed above the semiconductor substrate using one or more processing steps. The first die 110A also includes a guard region 208 within the semiconductor substrate, and a sealring region 206 above the guard ring region 208. The sealring region 206 includes the sealring structure 209 that is formed using a plurality of metal layers and metal vias between the metal layers. Similarly, the second die 110B includes device circuitry 214 formed within a semiconductor substrate using one or more processing steps, and second die 110B includes device interconnect layers 212 that are formed above the semiconductor substrate using one or more processing steps. The second die 110B also includes a guard region 218 within the semiconductor substrate, and a sealring region 216 above the guard region 218. The sealring region 216 includes the sealring structure 219 that is formed using a plurality of metal layers and metal vias between the metal layers. For embodiment 200, the sealring structures 209 and 219 have been formed using six metal layers (L1, L2, L3, L4, L5, L6) and metal vias through non-conductive layers that lie between these metal layers. When one or more cuts are made within the scribe lane 104 to singulate the semiconductor dice 110A/110B, the sealring structures 209/219 will be left at the edge of the dice 110A/110B to form a protective metal barrier that extends from the surface of the die to the substrate. It is also noted that the sealring structures 209/219 can be implemented with different and/or more complicated structures, including multiple ring stacks and/or other desired structures or combinations of structures. It is again noted that sealring structures are typically used for protective purposes, such as to reduce edge cracks, to reduce ionic contamination, and/or to serve other protective purposes.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale.

FIG. 13 is a top view and partial cross-section diagram for a sealring embodiment where a metal layer section of the sealring is left unformed to allow a connection route line to pass through.

FIG. 14 is a top view and partial cross-section diagram for a sealring embodiment where a gap is left within the sealring to allow a connection route line to pass through.

DETAILED DESCRIPTION

Embodiments are disclosed for semiconductor manufacturing using disposable test circuitry formed within scribe lanes. The manufacturing steps can include forming device circuitry within a semiconductor die and forming test circuitry within a scribe lane. One or more electrical connection route lines are also formed that connect the device circuitry and test circuitry blocks. Further, each die can be connected to a single test circuitry block, or multiple dice can share common test circuitry blocks. After testing, the electrical connection route line(s) are sealed, and the test circuitry is discarded when the device dice are singulated. Semiconductor dice manufactured using the disposable test circuitry include device circuitry and a connection route line extending from the device circuitry at least partially towards an edge of the die. For certain embodiments, the edge of the devices dice are encapsulated with a protective metal layer, and certain other embodiments include protective sealrings through which the connection route lines pass to enter the dice from the test circuitry blocks within the scribe lanes. Different features and variations can also be implemented, as desired, and related or modified systems and methods can be utilized, as well.

Figure 3:
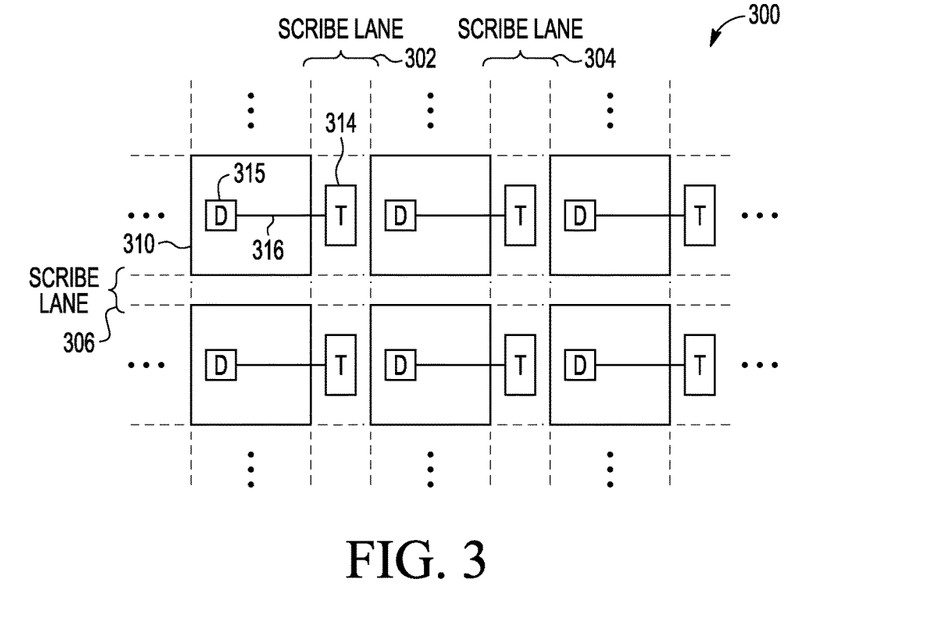
FIG. 3 is a top view diagram of an embodiment where disposable test circuitry is formed within scribe lanes during semiconductor processing for device dice.
Figure 4:
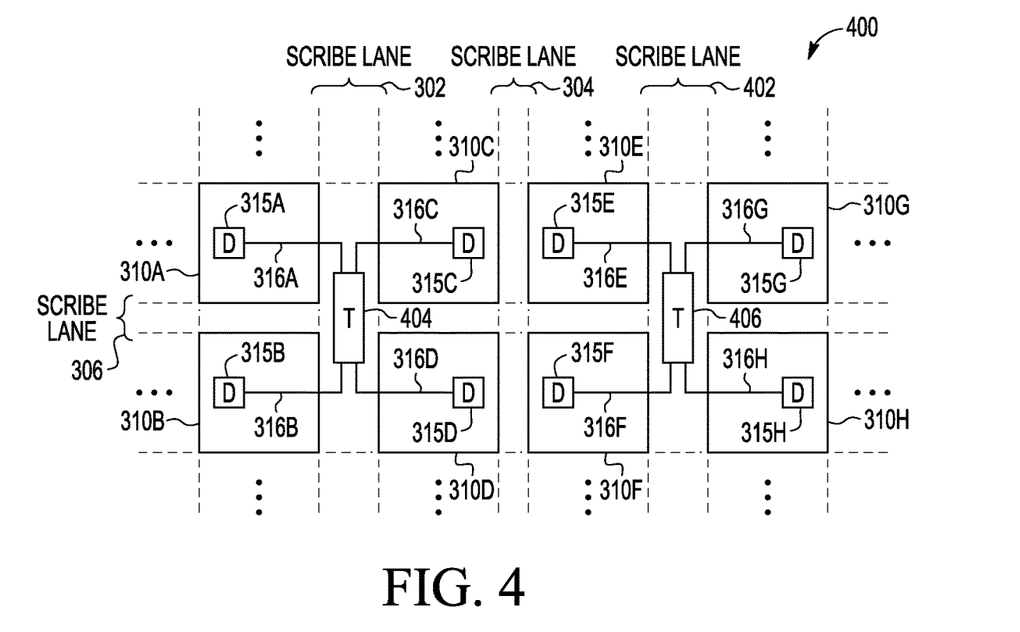
FIG. 4 is a top view diagram of an embodiment where the disposable test circuitry formed within scribe lanes is shared by multiple device dice.

FIGS. 3-4 provide example top views of example embodiments for disposable test circuitry formed within scribe lanes. FIGS. 5-14 provide example embodiments for processing steps that can be used with respect to test circuitry formed within scribe lanes and for subsequent sealing of the edges of the device dice.

As described with respect to these embodiments, the disclosed embodiments utilize one or more disposable test circuitry blocks formed within scribe lanes for semiconductor dice being processed on a substrate such as a semiconductor wafer. After the disposable test circuitry is used during the manufacturing process to test the device circuitry formed within the semiconductor dice, the disposable test circuitry is discarded when one or more cuts are made within the scribe lanes to singulate the dice. The edges of the integrated circuit dice are subsequently sealed, for example, by encapsulating the edges of the dice with a protective metal barrier. This encapsulation of the edge of the dice can be achieved with or without using sealring structures. Further, the disposable test circuitry can be shared by multiple dice to further decrease the surface area required on the semiconductor substrate for the disposable test circuitry. Advantageously, as the test circuitry blocks are formed within scribe lanes and discarded during manufacture, the disclosed embodiments reduce die area for the completed semiconductor die thereby allowing for smaller package sizes.

FIG. 3 is a top view diagram of an embodiment 300 where disposable test circuitry is formed within scribe lanes during semiconductor processing. For embodiment 300, a plurality of device dice are being formed on a semiconductor substrate, and scribe lanes 302, 304, and 306 represent locations where one or more cuts will be made to singulate the device dice. As represented with respect to device die 310, each device die has disposable test circuitry (T) 314 associated with it that is placed within a scribe lane, such as scribe lane 302, adjacent the device die. At least one connection route line 316 is made between the device circuitry (D) 315 formed on the device die and the test circuitry 314. As described further herein, the test circuitry 314 is used to test the device circuitry during manufacturing and is then has discarded when the device dice are singulated. As such, the test circuitry 314 is disposable. It is noted that the size of the scribe lanes 302, 304, and 306 can be adjusted depending upon the size and placement of the disposable test circuitry 314 associated with each of the device dice. Various configurations could be also used for locating test circuitry within scribe lanes. Further, while only a few dice are shown in embodiment 300, additional semiconductor device dice, test circuitry blocks, and related scribe lanes would be provided across the entire semiconductor substrate, such as a semiconductor wafer, being used for manufacturing the semiconductor device dice.

It is noted that the test circuitry can include transistors, diodes, resistors, capacitors, and/or other desired circuit elements and/or combinations of circuits elements formed within the semiconductor substrate to provide circuitry configured to be used to test device circuitry formed within the device dice. It is further noted that the disposable test circuitry blocks formed within the scribe lanes can be any desired test circuitry, such as for example, self test circuitry, process optimization structures, test points, and/or another other desired test structures. It is also noted that multiple connection route lines can also be formed between each device die and the test circuitry blocks, if desired. Further, it is noted that the semiconductor substrate described herein can be any desired semiconductor material or combination of materials, such as gallium arsenide, silicon germanium, silicon, monocrystalline silicon, other semiconductor materials, and combinations of these semiconductor materials. Still further, the substrate can be formed on top of other substrate materials including a separate non-semiconductor material, if desired, such as thin film semiconductor substrates formed on other semiconductor or non-semiconductor materials. Further variations could also be implemented, as desired.

FIG. 4 is a top view diagram of an embodiment 400 where the disposable test circuitry blocks formed within scribe lanes are shared by multiple device dice. For embodiment 400, four device dice 310A/310B/310C/310D share disposable test circuitry 404 that is formed within scribe lane 302. At least one connection route line 316A/316B/316C/316D is provided from the disposable test circuitry 404 to device circuitry 315A/315B/315C/315D for each of these four device dice. Similarly, four device dice 310E/310F/310G/310H share disposable test circuitry 406 that is formed within the scribe lane 402. At least one connection route line 316E/316F/316G/316H is provided from the disposable test circuitry 406 to device circuitry 315E/315F/315G/315H for each of these four device dice. It is noted that a combination of shared and non-shared test circuitry could also be formed within scribe lanes, if desired, while still utilizing the disposable test circuitry techniques described herein. It is also noted that each semiconductor die can be connected to one or more test circuitry blocks.

Figure 5:
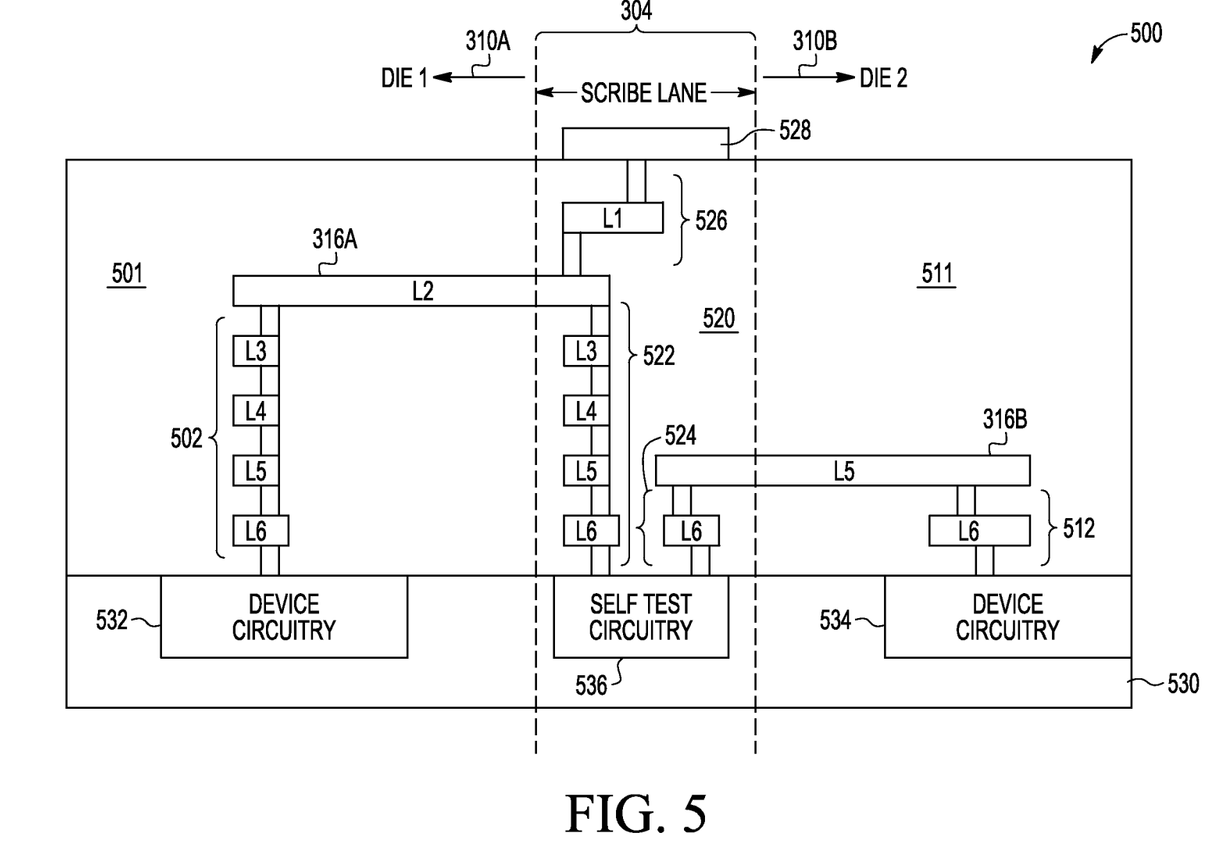
FIG. 5 is a cross-section view of an embodiment for shared test circuitry within a scribe lane between two device dice.

FIG. 5 is a cross-section view of an embodiment 500 for shared test circuitry within a scribe lane between two dice. In particular, for embodiment 500 depicted, a first die (DIE1) 310A is located to the left side of scribe lane 304, and a second die (DIE2) 310B is located to the right side of scribe lane 304. The first die 310A includes device circuitry 532 formed within the semiconductor substrate 530 and includes metal interconnect structure 502 formed within interconnect region 501. The connection route line 316A connects to the interconnect structure 502 using the second layer (L2), although other layers and/or multiple layers could also be used. Similarly, the second die 310B includes device circuitry 534 formed within semiconductor substrate 530 and includes metal interconnect structure 512 formed within interconnect region 511. The connection route line 316B connects to the interconnect structure 512 using the fifth layer (L5), although other layers and/or multiple layers could also be used. Interconnect structures 502 and 512 are formed using a plurality of metal layers and vias between these metal layers. Further, as indicated above, one or more additional connection route lines could also be utilized for the dice 310A/310B, if desired.

Test circuitry 536 is formed within a portion of the semiconductor substrate 530 that is within scribe lane 304. It is again noted that the test circuitry 536 can include transistors, diodes, resistors, capacitors, and/or other desired circuit elements and/or combinations of circuits elements formed within the substrate 530 to provide circuitry configured to be used to test device circuitry 532/534. Interconnect layers for this test circuitry 536 are formed within the interconnect region 520 for the scribe lane 304. In particular, interconnect structures 522, 524, and 526 are formed using a plurality of metal layers and vias between these metal layers. For embodiment 500, interconnect structures 522, 524, and 526 are formed using six metal layers (L1, L2, L3, L4, L5, L6) and vias through non-conductive layers that lie between these metal layers. A probe pad site 528 is formed on the top surface of the interconnect region 520 within the scribe lane, and this probe pad site 528 can be used to provide external access to the test circuitry. Interconnect structure 526 is formed between the probe site 528 and the second metal layer (L2). Interconnect structure 522 is formed between the second metal layer (L2) and the self test circuitry 536. And interconnect structure 524 is formed between the self test circuitry 536 and the fifth metal layer (L5).

Connection route lines 316A/316B connect the device circuitry 532/534 to the shared test circuitry 536. For the example embodiment depicted, connection route line 316A uses the second layer (L2) to connect to interconnect structure 502 so that the device circuitry 532 is electrically connected to the test circuitry 536. Similarly, connection route line 316B uses the fifth layer (L5) to connect to interconnect structure 512 so that the device circuitry 534 is electrically connected to the self test circuitry 536. Once the test circuitry 536 has been used to test the device circuitry 532/534 and/or is used for other test purposes, the test circuitry 536 is no longer needed. As described herein, when one or more cuts are made within the scribe lane 304 to singulate the semiconductor dice 310A/310B, the self test circuitry 536 is discarded.

Figure 6:
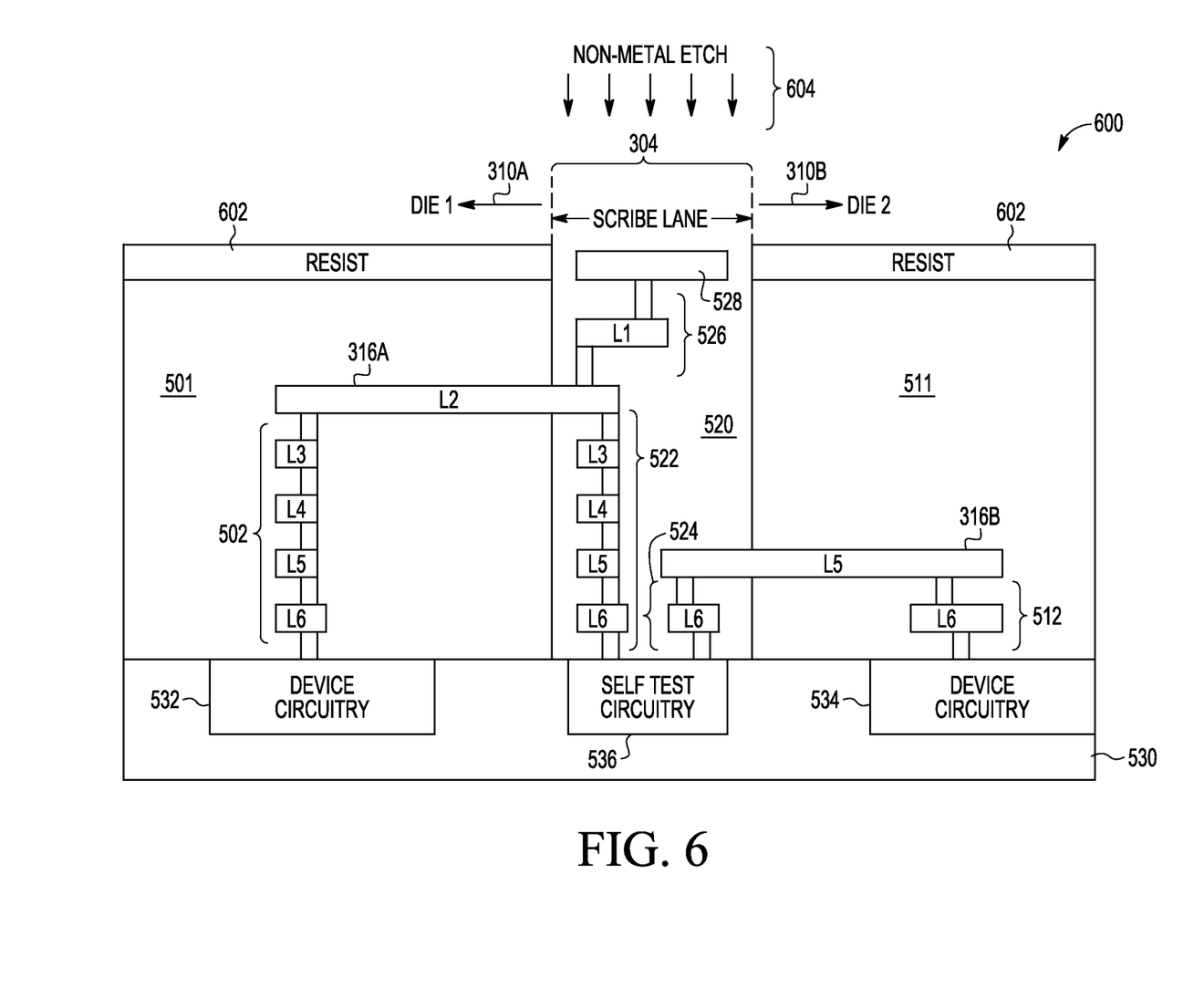
FIG. 6 is a cross-section view diagram of an embodiment after an etch processing step has been used to remove non-metal layers within the scribe lane.

FIG. 6 is a cross-section view diagram of an embodiment 600 after an etch processing step 604 has been used to remove non-metal layers within the scribe lane 304. First, a photoresist layer 602 is formed and patterned so that interconnect layer regions 501/511 for the device dice 310A/310B are covered and protected while the scribe lane 304 is left uncovered and unprotected. The etch processing step 604 is then used to etch the non-metal layers within the interconnect layer region for the scribe lane 304, which are shown as already being removed in embodiment 600. It is noted that a back-end-of-line (BEOL) deep trench etch can be used to remove the non-metal layers, although other etch processing steps could also be utilized. It is further noted that the non-metal layers can include, for example, one or more dielectric layers, such as oxide or nitride layers, and the BEOL deep trench etch can be implemented using any desired techniques. An example BEOL technique is plasma etching or reactive ion etching using an etchant gas containing fluorocarbons, and anisotropic etching can be accomplished by plasma etching in a plasma containing chlorine and argon or hydrogen bromide. Another example technique is through-silicon-via etch chemistry based on a plasma generated from a reactive gas, which can be a fluorine-based gas or any other reactant gas capable of etching silicon oxide at a relatively fast etch rate. Because the metal layers are typically dispersed in an inter-layer dielectric (ILD) material, a combination of a fluorine-based gas and a rapid ILD plasma etchant such as chlorine, hydrogen bromide, or hydrogen as the etchant, could be used. While these are dry etch implementations, it is also possible to etch the scribe lane with a wet chemical etch or with a combination of wet and dry etch chemistries. After the etch processing step 604 has completed, metal layers (L1, L2, L3, L4, L5, L6) and related vias remain within the interconnect layer region for the scribe lane 304.

Figure 7:
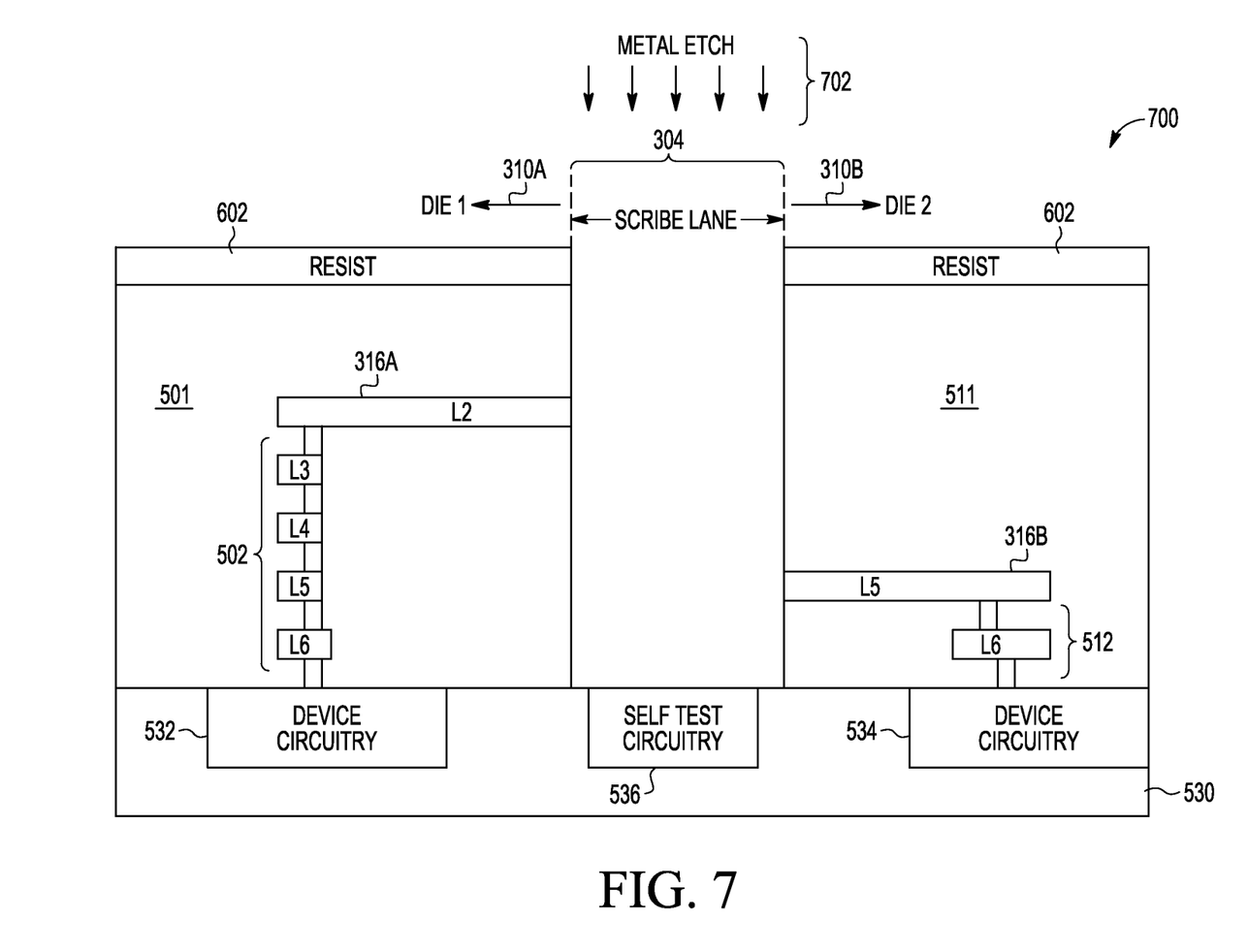
FIG. 7 is a cross-section view diagram of an embodiment after a metal etch processing step has been used to remove metal layers within the scribe lane.

FIG. 7 is a cross-section view diagram of an embodiment 700 after a metal etch processing step 702 has been used to remove metal layers within the scribe lane 304. The photoresist layer 602 is left covering the interconnect layer regions 501/511 for the device dice 310A/310B. The metal etch processing step 702 is then used to etch the metal layers and vias within the interconnect layer region for the scribe lane 304 that were left after the non-metal etch processing step of embodiment 600 in FIG. 6. These metal layers and vias are shown as already being removed in embodiment 700. It is noted that a back-end-of-line (BEOL) deep trench metals etch can be used to remove the metal layers, although other etch processing steps could also be utilized. It is further noted that the metal layers can include, for example, one or more conductive metal layers, such as aluminum, copper, tantalum, tungsten, titanium, and/or other desired metal layers, and the BEOL deep trench metals etch can be implemented using any desired etching technique. For example, an isotropic dry etchant, such as chlorine, can be used. A wet chemical etchant, such as phosphoric acid, nitric acid, or acetic acid, can also be used. After the metal etch processing step 702 has completed, only the substrate 530 and self test circuitry 536 are left within the scribe lane 304. It is further noted that a combination of dielectric and metal etch may be employed such that non-metal etch 604 and metal etch 702 occur simultaneously or in multiple non-metal etch/metal etch repeated cycles. Other variations could also be implemented.

Figure 8:
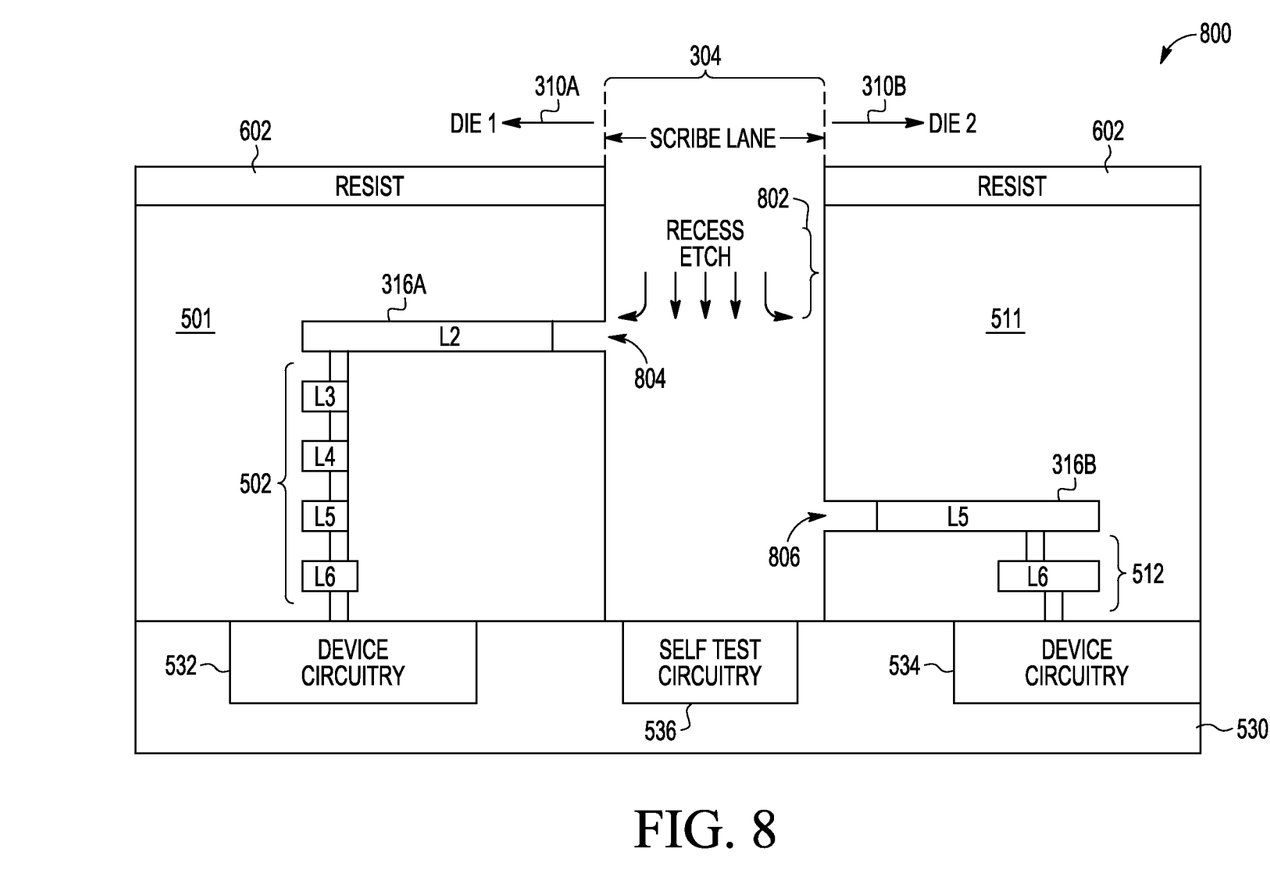
FIG. 8 is a cross-section view of an embodiment after a recess etch processing step has been used to etch back the connection route lines between the test circuitry and the device dice.

FIG. 8 is a cross-section view of an embodiment 800 after a metal recess etch processing step has been used to etch back the metal layers used for the connection route lines 316A/316B. The photoresist layer 602 is left covering the interconnect layer regions 501/511 for the device dice 310A/310B. The metal recess etch processing step 802 is then used to etch back the metal layer (L2) for connection route line 316A from the edge of the scribe lane 304 to form a recess 804. Similarly, the metal recess etch processing step 802 is used to etch back the metal layer (L5) for connection route line 316B from the edge of the scribe lane 304 to form a recess 806. It is noted that wet and/or dry recess etch processing steps can be used to etch back the metal layers. It is further noted that the recess etch can use an isotropic metal etchant that is selective to the metal used for the connection route lines 316A/316B. For example, if copper is used for the metal layers that form the connection route lines 316A/316B, then an isotropic etchant that is selective to copper can be used, such as a chlorine etchant for an isotropic dry etch or such as phosphoric acid, nitric acid, or acetic acid for a wet chemical etch. After the metal recess etch processing step 802 has completed, recesses 804/806 are left within the edges of the scribe lane 304. It is further noted that the metal etch 702 in FIG. 7 and the metal recess etch 802 in FIG. 8 could be combined and performed simultaneously or as part of multiple etch cycles. Other variations could also be implemented to form the recesses 804/806.

Figure 9:
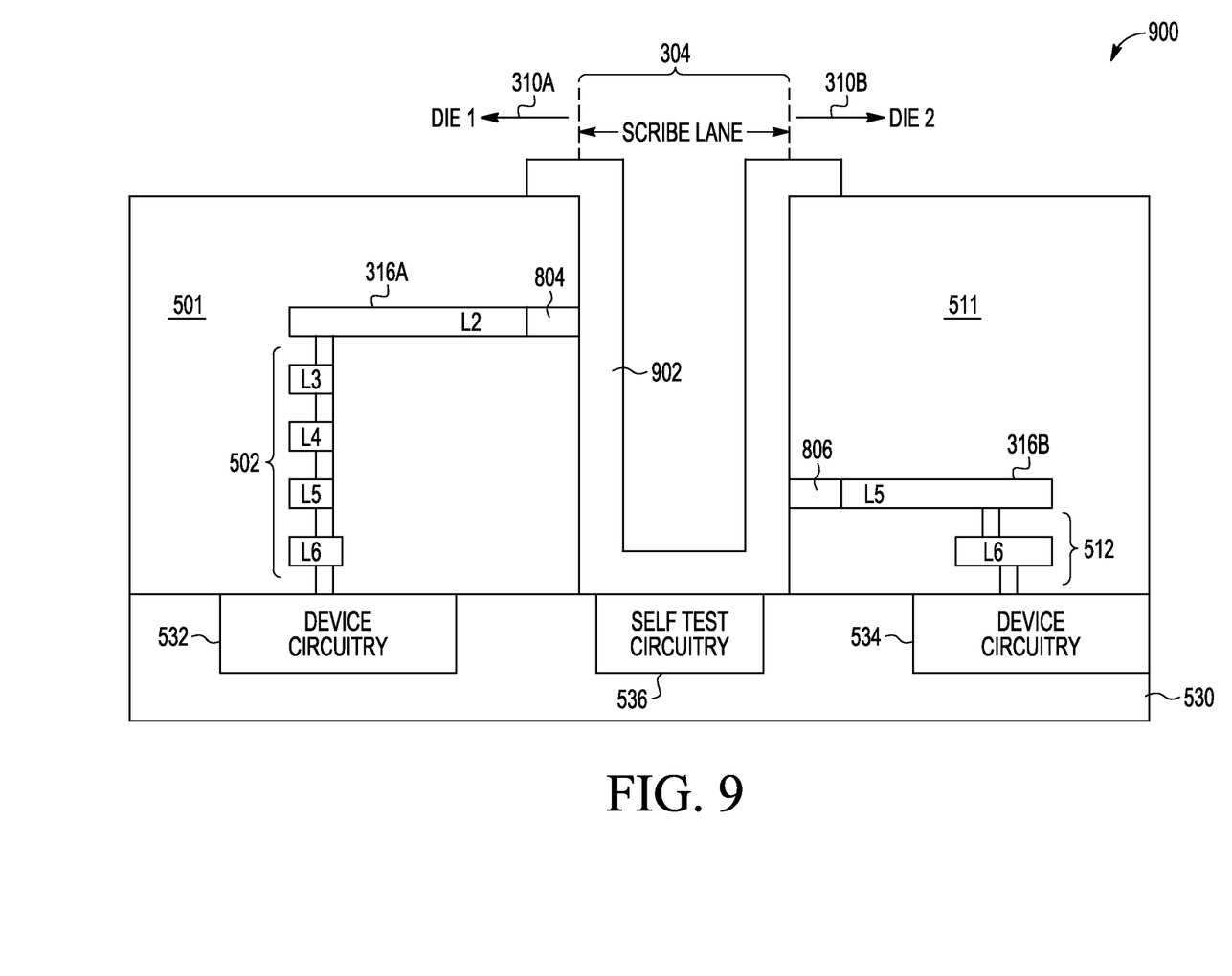
FIG. 9 is a cross-section view of an embodiment after a protective metal layer has been formed within the scribe lane to encapsulate the edges of the device dice.

FIG. 9 is a cross-section view of an embodiment 900 after a protective metal layer 902 has been formed within the scribe lane 304 to encapsulate the edges of the device dice 310A/310B. The protective metal layer 902 can be, for example, an aluminum layer, a copper layer, or another desired metal layer. The protective metal layer 902 effectively seals the edges of the dice 310A/310B where connection route lines 316A/316B pass into the dice 310A/310B. The recesses 804/806 keep the metal protective layer 902 from electrically connecting to the remaining connection route lines 316A/316B. Further, the protective metal layer 902 can be formed around the entire edge of the device dice 310A/310B to provide an effective metal barrier for the device dice 310A/310B. It is noted that the metal protective layer 902 can be formed, for example, by depositing aluminum, copper, or another desired metal through a conformal vapor deposition process. Other processing steps could also be used to form metal layer 902, if desired. It is further noted that patterning and metal etching steps can be used after the metal protective layer 902 has been formed to remove the metal protective layer from above the device dice 310A/310B.

Figure 10:
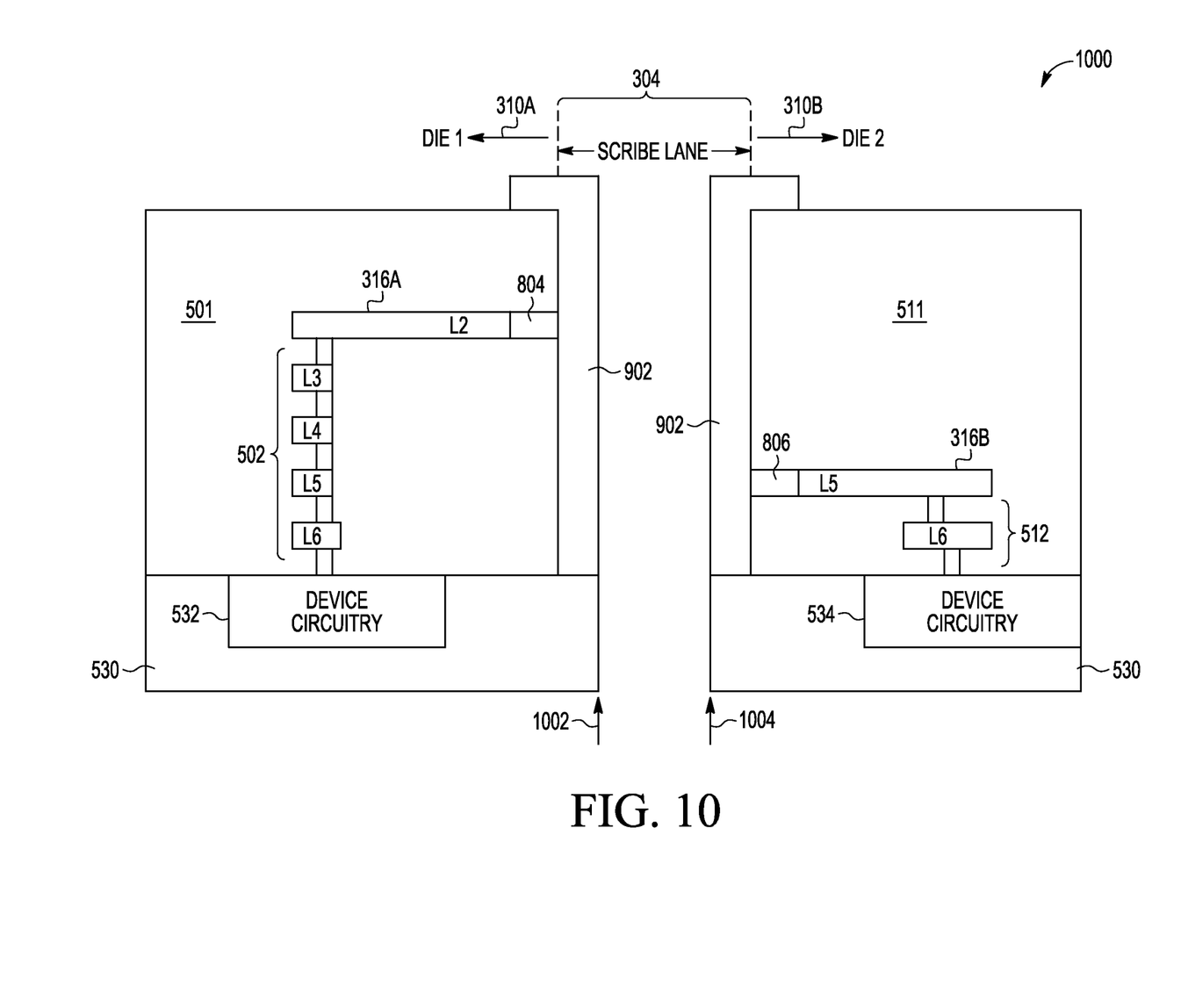
FIG. 10 is a cross-section view of an embodiment after one or more cuts have been made within the scribe lane to singulate device dice.

FIG. 10 is a cross-section view of an embodiment 1000 after one or more cuts have been made within the scribe lane 304 to singulate device dice 310A/310B along edges 1002/1004 within the scribe lane 304. As described herein, the test circuitry 536 is no longer needed and is discarded when dice are singulated during manufacture. It is noted that the particular location for the scribe lane cuts and thereby edges 1002/1004 can be selected, as desired, and a die saw can be used to make the one or more scribe lane cuts within scribe lane 304, as well as other cuts used to singulate the dice. It is noted that at least a portion of the metal protective layer 902 is left along the edge of device dice 310A/310B with respect to the scribe lane 304. As described above, this metal protective layer 902 effectively seals the edges of the device dice 310A/310B where the connection route lines 316A/316B passed to make the connection between the device circuitry 532/534 and the test circuitry 536. It is noted that the metal protective layer 902 in sealing the edges of the device dice 310A/310B is effectively serving the purpose of the sealring structures described with respect to FIGS. 1-2 (Prior Art) in that it in-part aids in protecting the die, such as in preventing dielectric cracking and/or ionic contamination.

Figure 11:
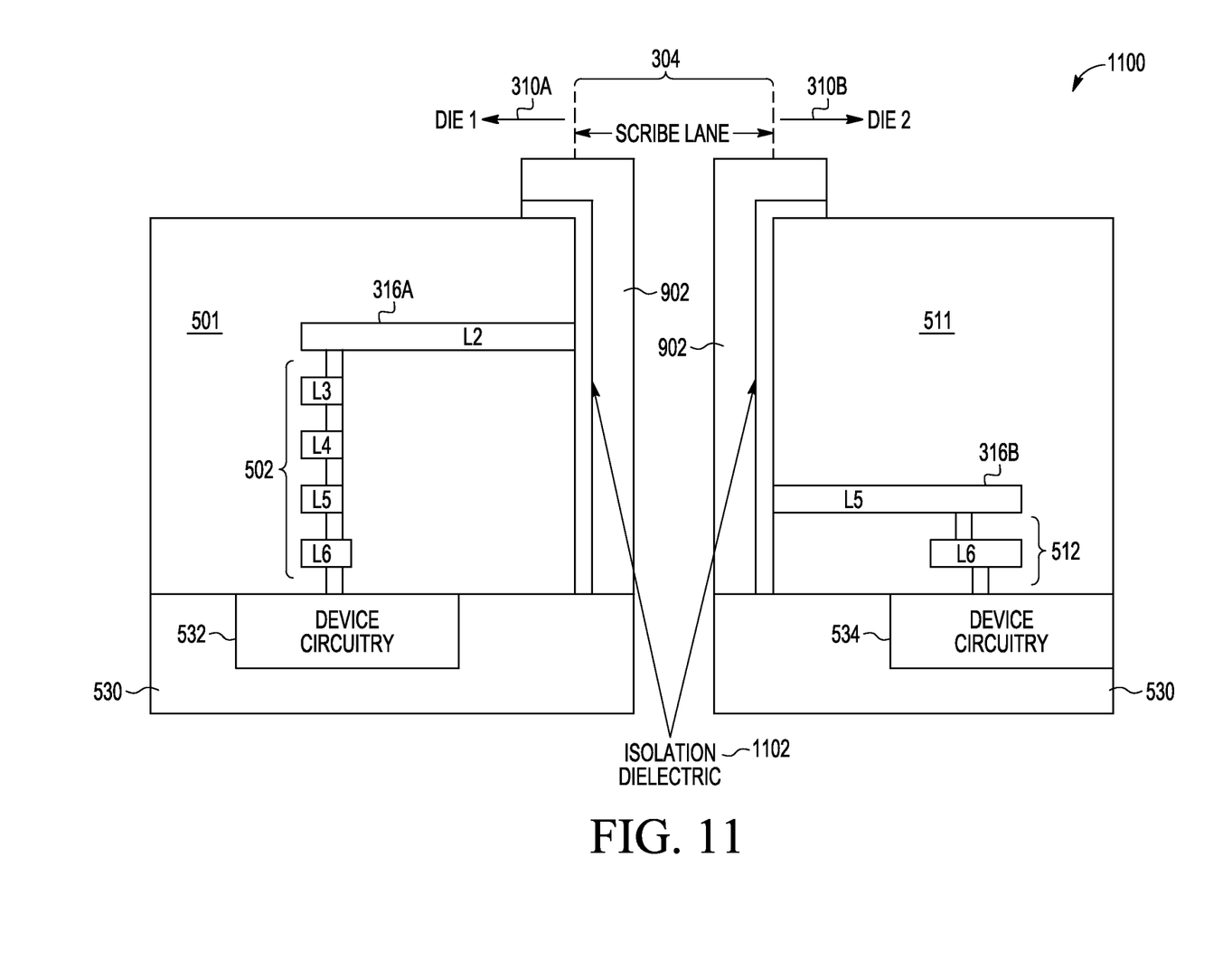
FIG. 11 is a cross-section view of an example embodiment where isolation dielectric layers are formed along the edges of the device dice within the scribe lane.

FIG. 11 is a cross-section view of an example embodiment 1100 where isolation dielectric layers 1102 are formed along the edges of the device dice within the scribe lane 304. The isolation dielectric layers 1102 are formed prior to the formation of the metal protective layer 902, and these layers 1102 act to keep the connection route lines 316A/316B from electrically connecting to the later formed metal protective layer 902. As such, the metal recess etch processing step 802 of embodiment 800 is not needed, although it could still be utilized if desired. It is noted that the isolation dielectric layer 1102 can be an oxide, nitride, or another desired dielectric material. It is also noted that the isolation dielectric layer 1102 can be deposited and/or grown depending upon the dielectric material chosen. For example, if a nitride layer is used, the nitride layer can be formed by plasma deposition from silane and ammonia. It is further noted that a portion of the dielectric layer 1102 above the substrate and below where metal protective layer 902 will be formed can be removed with an etch processing step prior to formation of the metal protective layer 902. As such, the metal protective layer 902 touches the substrate 530 as shown in FIG. 11. Alternatively, this portion of the dielectric layer 1102 can be left over the substrate 520 so that this portion of the dielectric layer 1102 is positioned between the metal protective layer 902 and the substrate 530. Other variations could also be implemented.

Figure 12:
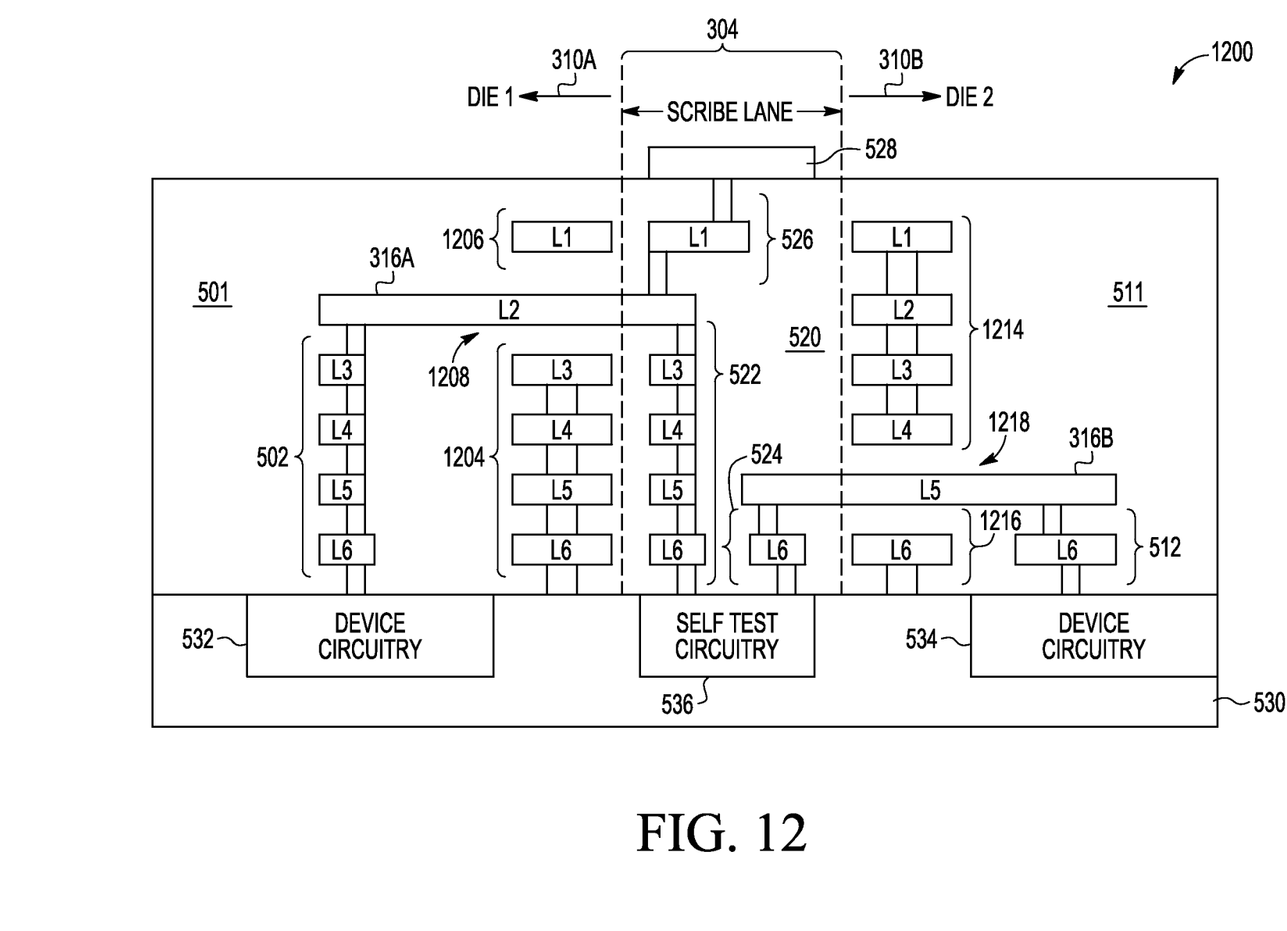
FIG. 12 is a cross-section view of an example embodiment where connection route lines pass through sealring structures at the edges of the device dice.

FIG. 12 is a cross-section view of an embodiment 1200 where connection route lines pass through sealring structures at the edges of the device dice. For the example embodiment 1200 depicted, the first die 310A includes a sealring structure formed by stacked metal layers 1204 and 1206, and the connection route line 316A passes through an open section 1208 within this sealring structure. As such, sealring interconnect layers 1204 and 1206 for the first die 310A include on open section for the second layer (L2) that is used for the connection route line 316A. Similarly, the second die 310B includes a sealring structure formed by stacked metal layers 1214 and 1216, and the connection route line 316B passes through an open section 1218 within this sealring structure. As such, sealring interconnect layers 1214 and 1216 for the second die 310B include an open section for the fifth layer (L5) that is used for the connection route line 316B. It is noted that additional connection route lines and open sections within the sealring structures could also be utilized, if desired. Further, as described above, the interconnect layers and dielectric materials within the interconnect region 520 for the scribe lane 304 can be removed, and a metal protective layer 902 can be formed to effectively seal the open sections 1208/1218 within the sealring structures for the dice 310A/310B. Still further, the metal protective layer 902 could be formed only with respect to the portions of the sealring structures including the open sections 1208/1218, as the other portions of the die would be protected by the sealring structures. An isolation dielectric layer 1102, such as shown in FIG. 11, could also be utilized. Other variations could also be implemented, as desired.

Figure 13:
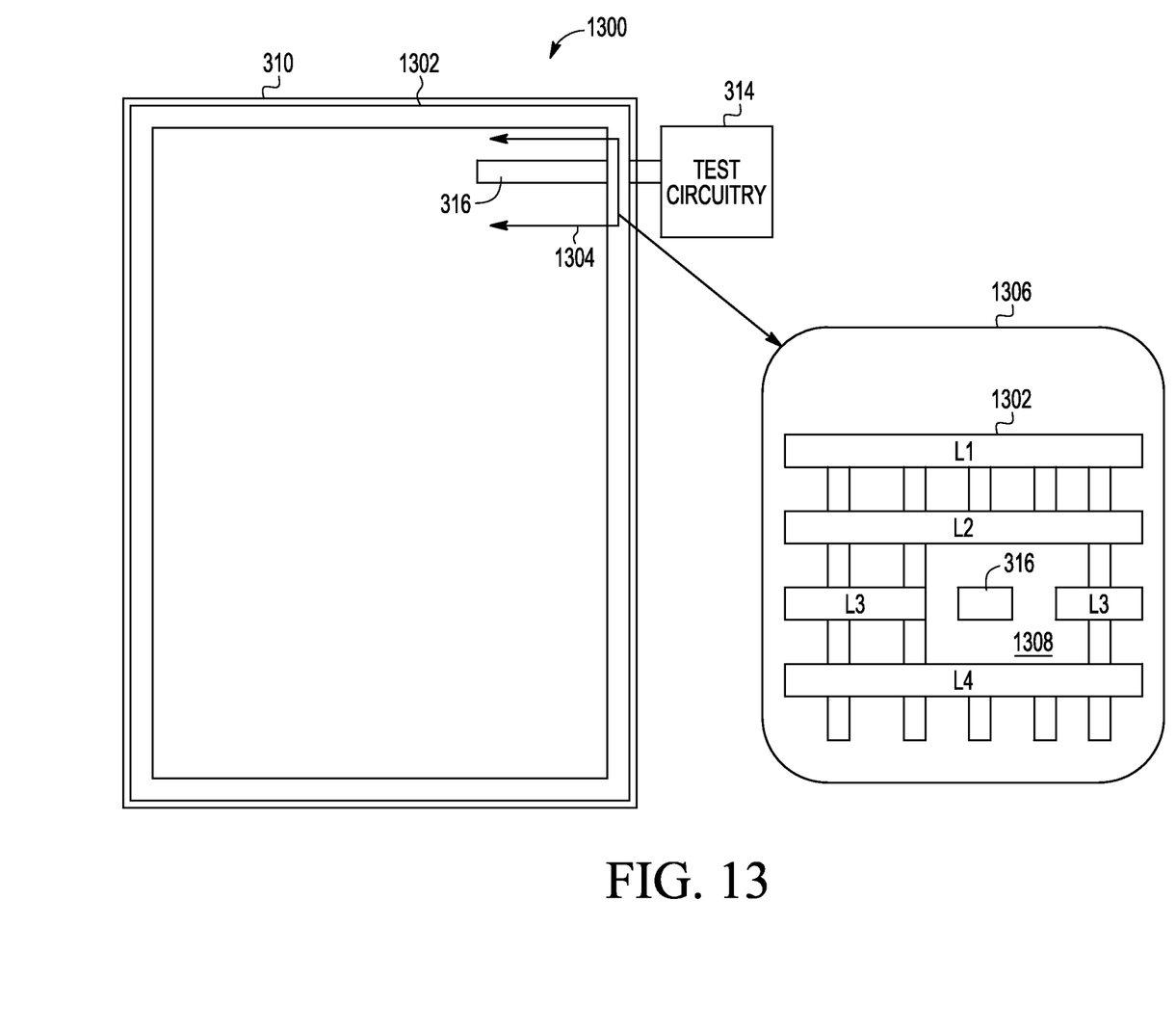

FIG. 13 is a top view and partial cross-section diagram for a sealring embodiment 1300 where section 1308 of a sealring 1302 is left open and unformed to allow a connection route line 316 to pass through. For the example embodiment 1300 depicted, an annular sealring 1302 has been formed around the edges of the device die 310. The connection route line 316 for the test circuitry 314 passes through an open section 1308 for the sealring 1302. View 1306 provides a cross-section view for this pass-through at the sealring portion indicated by view lines 1304. Looking to the cross-section view 1306, it is seen that four metal layers (L1, L2, L3, L4) and related vias between these layers have been used to form the sealring 1302. An open section 1308 with respect to third layer (L3) is left unformed within the sealring 1302 to allow the connection route line 316 to pass through. As indicated above with respect to FIG. 12, a metal layer 902 can be formed to encapsulate the edges of the die, and an isolation dielectric layer 1102 could also be used. It is again noted that additional connection route lines and open sections could also be utilized, and different configurations for the sealring and open section(s) can also be utilized including different numbers of metal layers. Other variations could also be implemented, as desired.

Figure 14:
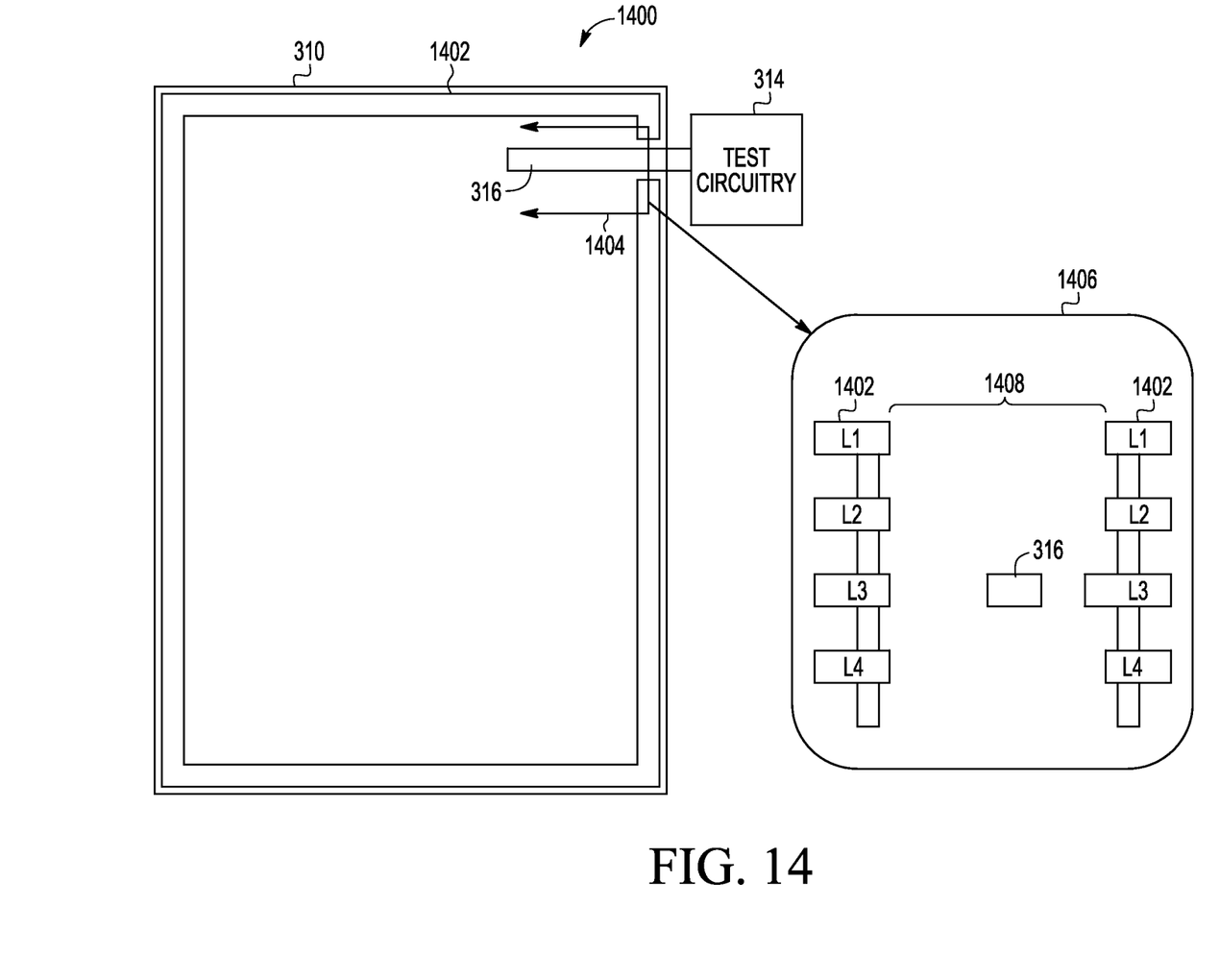

FIG. 14 is a top view and partial cross-section diagram for a sealring embodiment 1400 where a gap 1408 is left within the sealring 1402 to allow a connection route line 316 to pass through. For the example embodiment 1400 depicted, an annular sealring 1402 has been formed around the edges of the device die 310. The connection route line 316 for the test circuitry 314 passes through a gap 1408 for the sealring 1402. View 1406 provides a cross-section view for this pass-through as indicated by view lines 1404. Looking to the cross-section view 1406, it is seen that four metal layers (L1, L2, L3, L4) and related vias between these layers have been used to form the sealring 1402. An unformed portion of the sealring 1402 provides a gap 1408 through which the connection route line 316 passes through using the third metal layer (L3). It is again noted that additional connection route lines and gaps could also be utilized, and different configurations for the sealring and gap(s) can also be utilized including different numbers of metal layers. Further, as described above, a metal protective layer 902 as shown in FIG. 9 can be formed to encapsulate the edges of the die. An isolation dielectric layer 1102, such as shown in FIG. 11, could also be utilized. Still further, the metal protective layer 902 could be formed only with respect to the portions of the sealring 1402 including the gap 1408, as the other portions of the die would be protected by the sealring.

It is further noted that sealring gaps as shown in FIG. 14 could be used in combination with open sections within the sealring as shown in FIG. 13. Further, where sealrings are utilized, they can be configured formed along any desired portion of the edge of the device die. Metal layer encapsulation layers, such as those shown in FIG. 9, could be used in combination with partial sealrings and/or complete sealrings, as desired. Still further, device dice could be left without a sealring and without metal layer encapsulation, if desired, such that no protective metal barrier would exist at the edges of the die. Other variations could also be implemented, as desired, while still utilizing disposable test circuitry within scribe lanes as described herein.

As described herein, a variety of embodiments can be implemented and different features and variations can be implemented, as desired.

For one embodiment, a method for manufacturing integrated circuits is disclosed that includes forming device circuitry for a plurality of dice within a semiconductor substrate, forming a plurality of test circuitry blocks within scribe lanes of the substrate for the plurality of dice, and forming at least one electrical connection route line for each die that connects device circuitry on the die to at least one of test circuitry blocks. In some embodiments, each die is connected to a separate test circuitry block of the plurality of test circuitry blocks. In other embodiments, a plurality of dice are connected to each test circuitry block of the plurality of test circuitry blocks. For still further embodiments, each of the plurality of test circuitry blocks can include transistors formed within the substrate.

For further embodiments, the method includes forming an annular sealring around an edge of each die of the plurality of dice, and the electrical route line for each die passes through the annular sealring. In some embodiments, each annular sealring can include at least one gap through which the at least one electrical connection route line passes, the gap being an unformed portion of the sealring. For other embodiments, each annular sealring can include at least one open section through which the at least one electrical connection route line passes, the open section including at least one unformed metal layer within a portion of the sealring. For still further embodiments, the method can include removing the electrical connection route lines within the scribe lanes, and forming a metal protective layer for each die to cover a portion of the sealring structure through which the electrical connection route line passes for each die.

For additional embodiments, the method can further include using the test circuitry and subsequently cutting the semiconductor substrate within the scribe lanes to form singulated dice wherein the cutting removes the plurality of test circuitry blocks formed within the scribe lanes. In some embodiments, the method can further include forming interconnect layers for the test circuitry blocks within the scribe lanes and removing the interconnect layers prior to cutting the semiconductor substrate to form singulated dice. For other embodiments, the method can include forming a protective metal layer on an edge of each die prior to forming singulated dice. Further, the method can include etching the at least one electrical connection route line for each die to form a recess associated with the electrical connection route line prior to forming the protective metal layer. In addition, the method can further include forming dielectric layers to cover the electrical connection route lines prior to forming the metal layers. Still further, the protective metal layer can be formed on all edges of each die.

For another embodiment, an integrated circuit die is disclosed including device circuitry formed within the die, a protective structure formed on an edge of the die, and at least one connection route line coupled to the device circuitry and terminating proximate a portion of the protective structure.

For other embodiments, the protective structure can be a protective metal layer formed on the edge of the die. Further, the integrated circuit die can include a dielectric layer formed between the protective metal layer and the edge of the die. Still further, the integrated circuit die can include a recess associated with the at least one connection route line adjacent the edge of the die.

In further embodiments, the protective structure can be a sealring formed on the edge of the die. Further, the sealring structure can include at least one gap through which the at least one electrical connection route line passes, the gap being an unformed section of the sealring structure. Still further, each sealring structure can include at least one open section through which the at least one electrical connection route line passes, the open section including at least one unformed metal layer within a section of the sealring structure.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. An integrated circuit die, comprising:
   device circuitry formed within the die;
   an interconnect region formed over the device circuitry and including a plurality of metal layers, the interconnect region extending to an edge of the die;
   a protective structure formed on the edge of the die, the protective structure comprising a protective metal layer formed on the edge of the die;
   at least one connection route line coupled to the device circuitry and terminating proximate a portion of the protective structure, wherein a connection route line of the at least one connection route line is located in a metal layer of the plurality of metal layers below a top metal layer of the plurality of metal layers, wherein the protective metal layer is located on the edge of the die at a location corresponding the metal layer; and
   an etched recess extending from the edge of the die to the connection route line to keep the protective metal layer from electrically connecting to the connection route line.

2. The integrated circuit die of claim 1, further comprising a dielectric layer formed between the protective metal layer and the edge of the die.

3. The integrated circuit die of claim 1, wherein the protective structure comprises a sealring structure formed on the edge of the die.

4. The integrated circuit of claim 3, wherein the sealring structure includes at least one gap through which the at least one electrical connection route line passes, the gap being an unformed section of the sealring structure.

5. The integrated circuit of claim 3, wherein each sealring structure includes at least one open section through which the at least one electrical connection route line passes, the open section including at least one unformed metal layer within a section of the sealring structure.

* * * * *